United States Patent
Qin

(10) Patent No.: US 10,727,872 B2
(45) Date of Patent: Jul. 28, 2020

(54) ENCODING AND DECODING OF HAMMING DISTANCE-BASED BINARY REPRESENTATIONS OF NUMBERS

(71) Applicant: Western Digital Technologies, Inc., San Jose, CA (US)

(72) Inventor: Minghai Qin, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 168 days.

(21) Appl. No.: 15/933,697

(22) Filed: Mar. 23, 2018

(65) Prior Publication Data

US 2019/0215014 A1    Jul. 11, 2019

Related U.S. Application Data

(60) Provisional application No. 62/615,569, filed on Jan. 10, 2018.

(51) Int. Cl.

| | | |
|---|---|---|
| *H03M 13/00* | (2006.01) | |
| *H03M 13/19* | (2006.01) | |
| *H03M 13/25* | (2006.01) | |
| *G06F 11/10* | (2006.01) | |
| *G11C 29/52* | (2006.01) | |

(Continued)

(52) U.S. Cl.
CPC ......... *H03M 13/19* (2013.01); *G06F 11/1044* (2013.01); *G11C 29/52* (2013.01); *H03M 7/24* (2013.01); *H03M 13/05* (2013.01); *H03M 13/255* (2013.01); *G11C 13/0004* (2013.01); *G11C 2029/0411* (2013.01)

(58) Field of Classification Search
CPC ........ H03M 13/19; H03M 7/24; H03M 13/05; H03M 13/255; H03M 1/285; H03M 13/1174; H03M 13/1575; G06F 11/1044; G06F 11/1012; G11C 29/52; G11C 2029/0411; G11C 13/0004
USPC .................................................. 714/752, 777
See application file for complete search history.

(56) References Cited

U.S. PATENT DOCUMENTS

| | | | | |
|---|---|---|---|---|
| 5,491,479 A | * | 2/1996 | Wilkinson | ........... H04N 5/9264 341/58 |
| 6,084,535 A | * | 7/2000 | Karabed | .......... G11B 20/10009 341/106 |

(Continued)

*Primary Examiner* — Albert Decady
*Assistant Examiner* — Osman M Alshack
(74) *Attorney, Agent, or Firm* — Vierra Magen Marcus LLP

(57) ABSTRACT

Systems and methods for dynamically encoding and decoding binary numbers using linear-time algorithms that encode and decode Hamming Distance-Based representations for the binary numbers are described. The binary numbers may correspond with integer values, such as 64-bit, 128-bit, or 256-bit integer values. In some cases, in response to detecting that a binary number is to be stored using a particular type of memory (e.g., a phase change memory), the binary number may first be encoded using a Hamming Distance-Based representation and then the encoded data may be written to the particular type of memory. The binary number may be encoded by generating a binary string or a binary array representing the binary number such that if one bit flips within the binary string or the binary array, the maximum distortion in the number is less than a threshold amount (e.g., less than 256).

20 Claims, 11 Drawing Sheets

(51) Int. Cl.
*H03M 7/24* (2006.01)
*H03M 13/05* (2006.01)
*G11C 13/00* (2006.01)
*G11C 29/04* (2006.01)

(56) References Cited

U.S. PATENT DOCUMENTS

| | | | | |
|---|---|---|---|---|
| 6,404,820 | B1* | 6/2002 | Postol | H03M 13/15 |
| | | | | 341/200 |
| 7,149,955 | B1* | 12/2006 | Sutardja | H03M 13/19 |
| | | | | 714/809 |
| 8,223,042 | B2* | 7/2012 | Abbasfar | H03M 5/145 |
| | | | | 341/58 |
| 9,369,486 | B2* | 6/2016 | Lewis | H04L 9/003 |
| 9,912,352 | B1* | 3/2018 | Qin | H03M 7/6035 |
| 2014/0298459 | A1* | 10/2014 | Lewis | G06F 21/556 |
| | | | | 726/22 |
| 2016/0012255 | A1* | 1/2016 | Bringer | G06K 19/07309 |
| | | | | 713/189 |
| 2016/0352359 | A1* | 12/2016 | Ordentlich | H03M 13/51 |

* cited by examiner

300 ↘

| Binary | Floating Point |
|---|---|
| 0000 | 0.0 |
| 0001 | 0.0625 |
| 0010 | 0.125 |
| 0011 | 0.1875 |
| 0100 | 0.25 |
| 0101 | 0.3125 |
| 0110 | 0.375 |
| 0111 | 0.4375 |
| 1000 | 0.5 |
| 1001 | 0.5625 |
| 1010 | 0.625 |
| 1011 | 0.6875 |
| 1100 | 0.75 |
| 1101 | 0.8125 |
| 1110 | 0.875 |
| 1111 | 0.9375 |

| Binary | Floating Point |
|---|---|
| 0000 | 0.0 |
| 0001 | 0.0625 |
| 0010 | 0.125 |
| 0100 | 0.1875 |
| 1000 | 0.25 |
| 0011 | 0.3125 |
| 0101 | 0.375 |
| 0110 | 0.4375 |
| 1001 | 0.5 |
| 1010 | 0.5625 |
| 1100 | 0.625 |
| 0111 | 0.6875 |
| 1011 | 0.75 |
| 1101 | 0.8125 |
| 1110 | 0.875 |
| 1111 | 0.9375 |

Fig. 4

| Hamming dist. based | INT |
|---|---|
| 0000 | 0 |
| 0001 | 1 |
| 0010 | 2 |
| 0100 | 3 |
| 1000 | 4 |
| 0011 | 5 |
| 0101 | 6 |
| 0110 | 7 |
| 1001 | 8 |
| 1010 | 9 |
| 1100 | 10 |
| 0111 | 11 |
| 1011 | 12 |
| 1101 | 13 |
| 1110 | 14 |
| 1111 | 15 |

ENCODING AND DECODING OF HAMMING DISTANCE-BASED BINARY REPRESENTATIONS OF NUMBERS

CLAIM OF PRIORITY

The present application claims priority to U.S. Provisional Application No. 62/615,569, entitled "Encoding and Decoding of Hamming Distance-Based Binary Representations of Numbers," filed Jan. 10, 2018, which is herein incorporated by reference in its entirety.

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PCM). In recent years, both volatile and non-volatile memory devices have been scaled in order to reduce the cost per bit. However, as process geometries shrink, many design and process challenges are presented. These challenges include increased variability in memory cell I-V characteristics over process, voltage, and temperature variations and increased susceptibility to chip-level soft errors.

Real numbers may be represented according to the IEEE 754 floating-point standard using 16 bits (half precision), 32 bits (single precision), or 64 bits (double precision). In one implementation, referring to FIG. 1, a floating-point number 10 has a binary representation in which one bit is used for the sign 12, "e" bits are used for an exponent 14, and "m" bits are used for a mantissa 16. Thus, the floating-point number 10 may be represented by a string of e+m+1 bits. This string of bits may be stored using a semiconductor memory and processed using a digital computer or processor in communication with the semiconductor memory.

BRIEF DESCRIPTION OF THE DRAWINGS

FIG. 3 depicts a naïve way of mapping numbers to binary strings.

FIG. 4 depicts one embodiment of mapping numbers to binary strings.

2

Figure 6A:
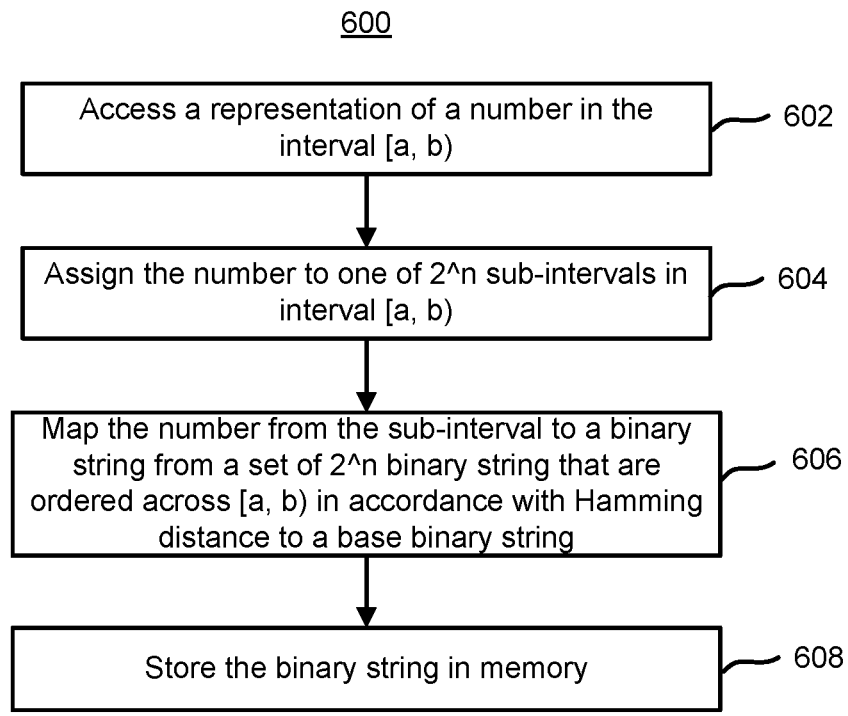
FIG. 6A is a flowchart of one embodiment of a process of mapping numbers to binary strings.
Figure 6B:
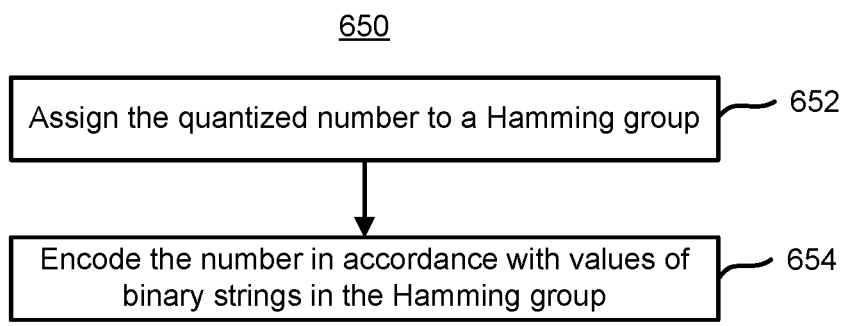

FIG. 6B is a flowchart of one embodiment of a process mapping quantized numbers to binary strings.

Figure 7:
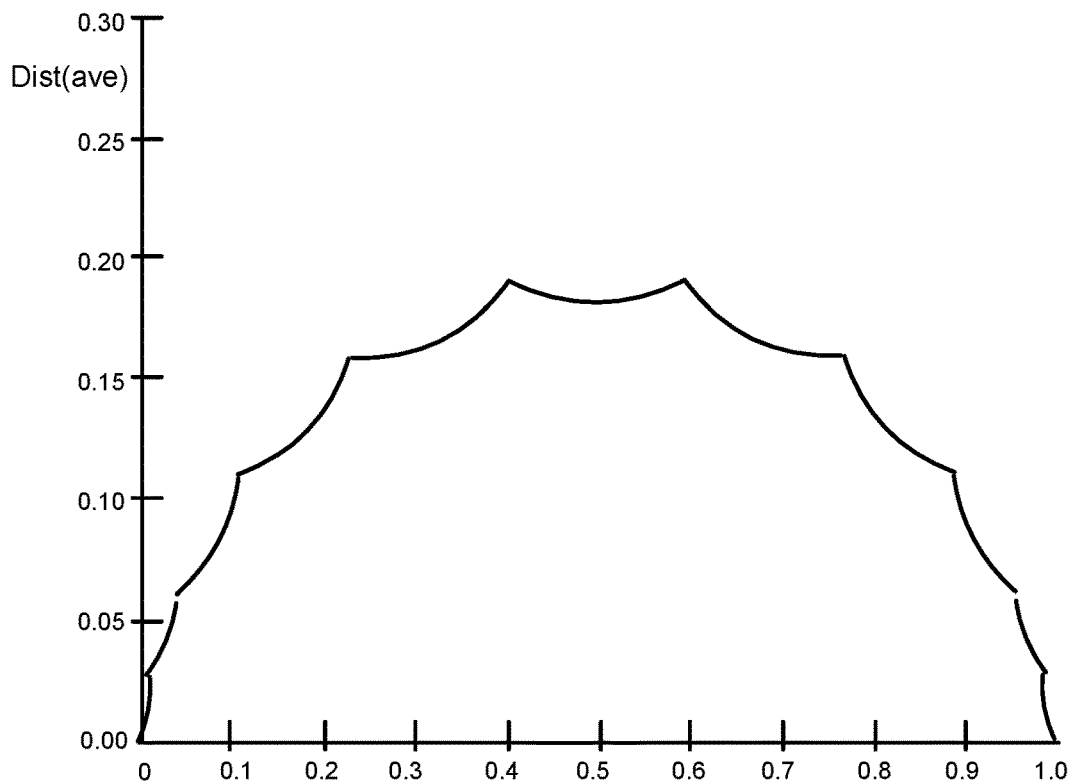
Figure 8:
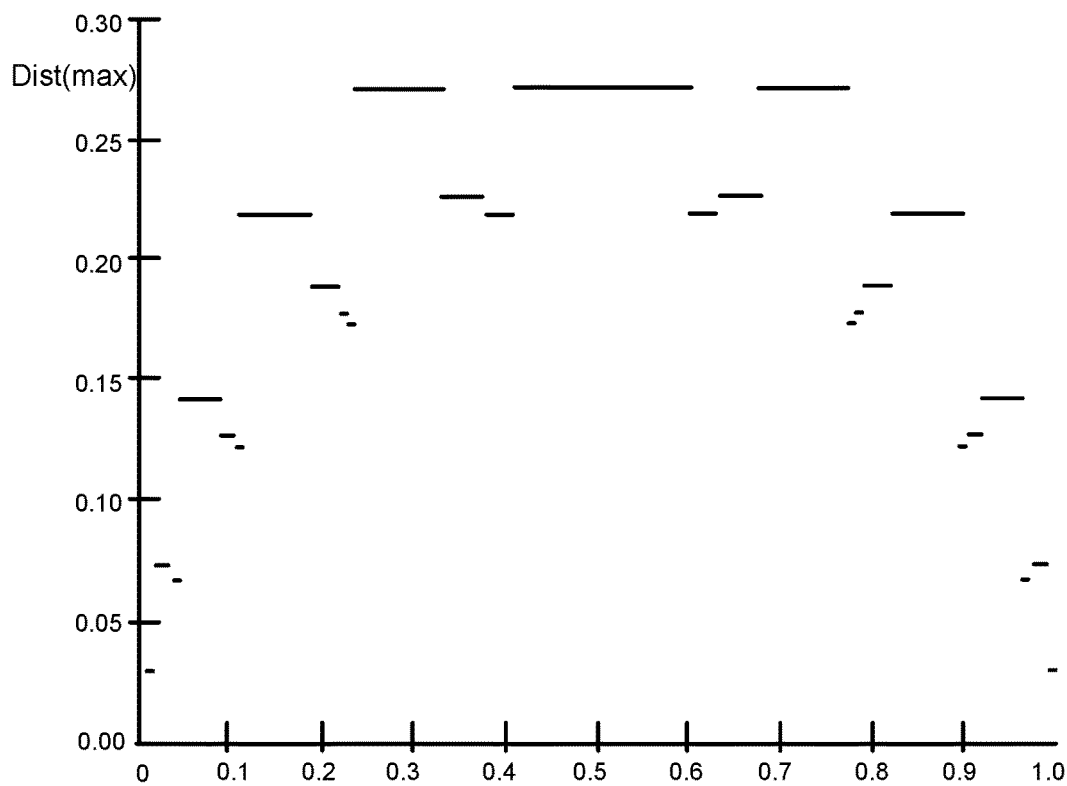

FIGS. 7-8 are diagrams to illustrate the distortion in a mapping of floating point numbers to binary strings.

Figure 9:
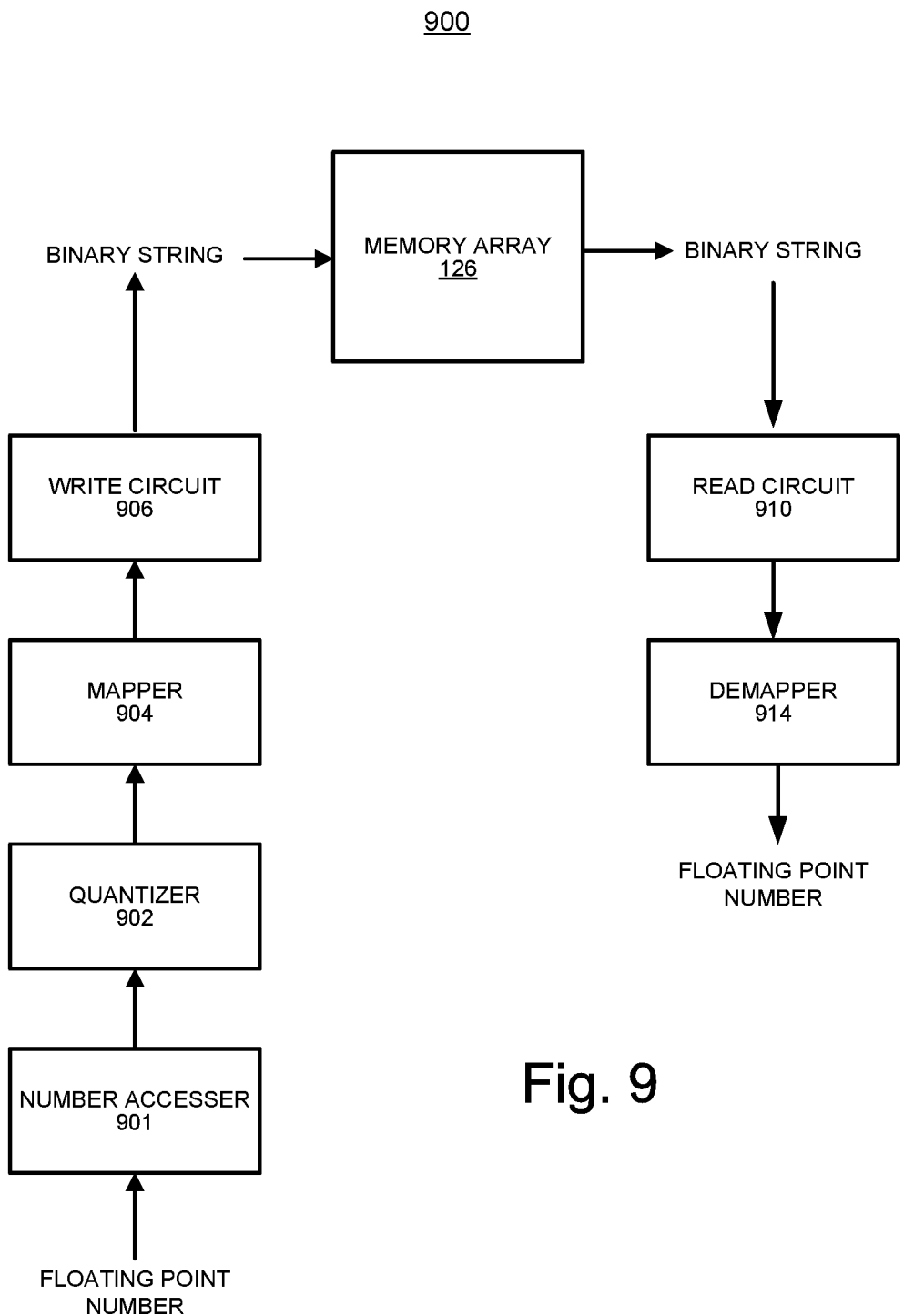

FIG. 9 is a diagram of one embodiment of a system that is configured to encode/decode between floating point numbers and binary strings.

FIG. 10 depicts a table showing a mapping of integers to binary strings.

Figure 11:
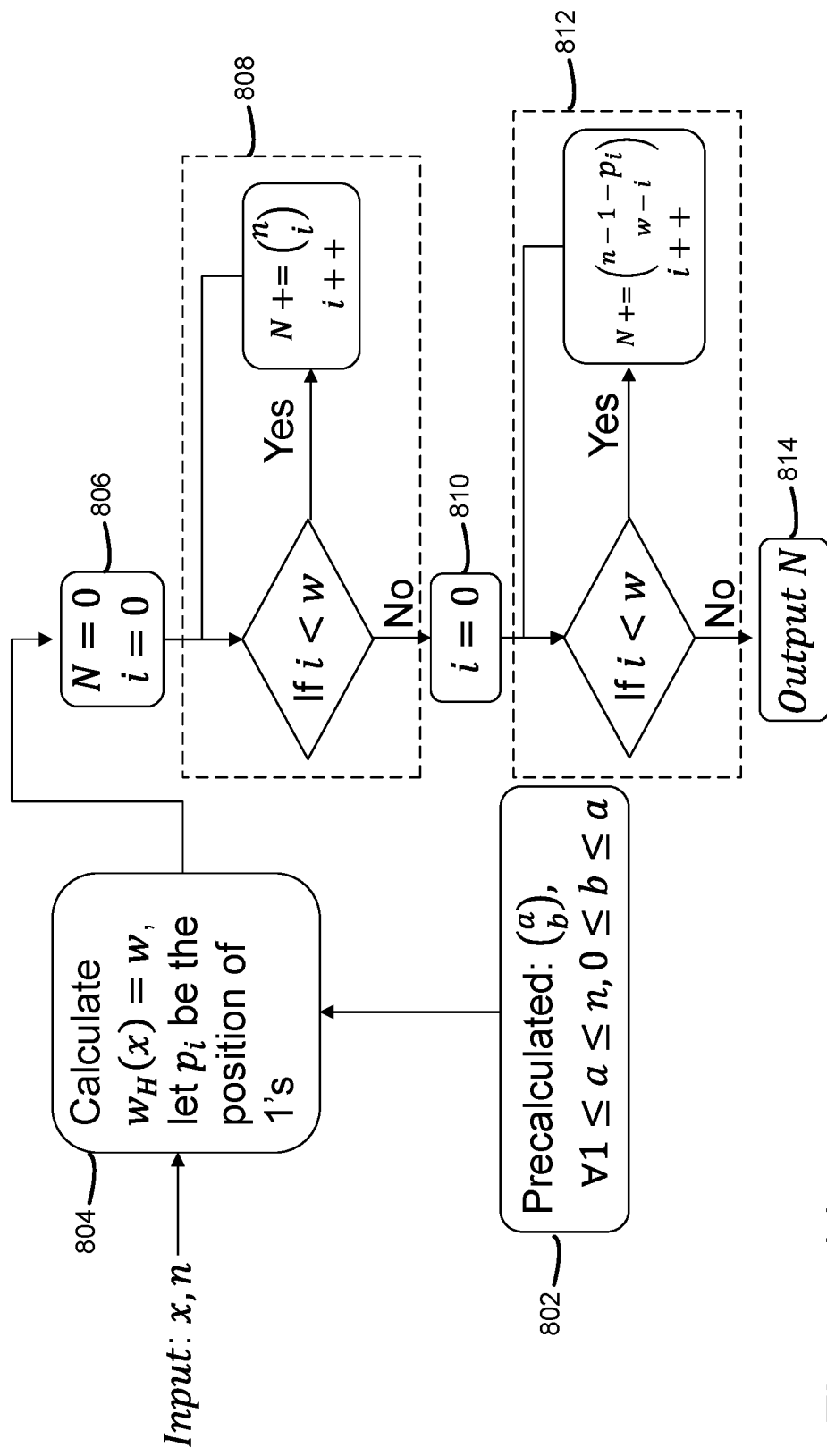

FIG. 11 depicts one embodiment of a flowchart for generating a binary number N for a Hamming distance-based encoding x.

Figure 12:
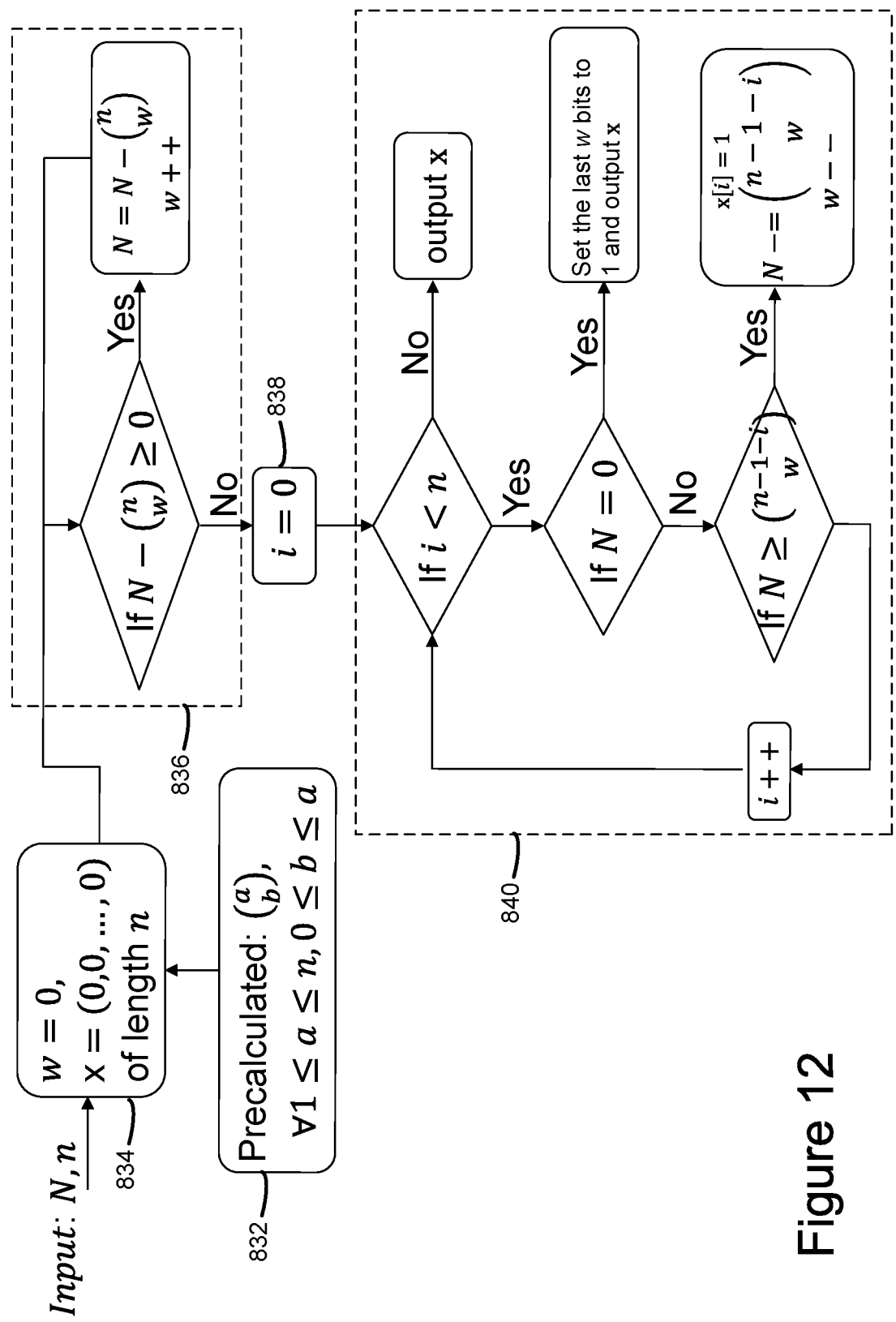

FIG. 12 depicts one embodiment of a flowchart for generating a Hamming distance-based encoding x for a binary number N.

Figure 13:
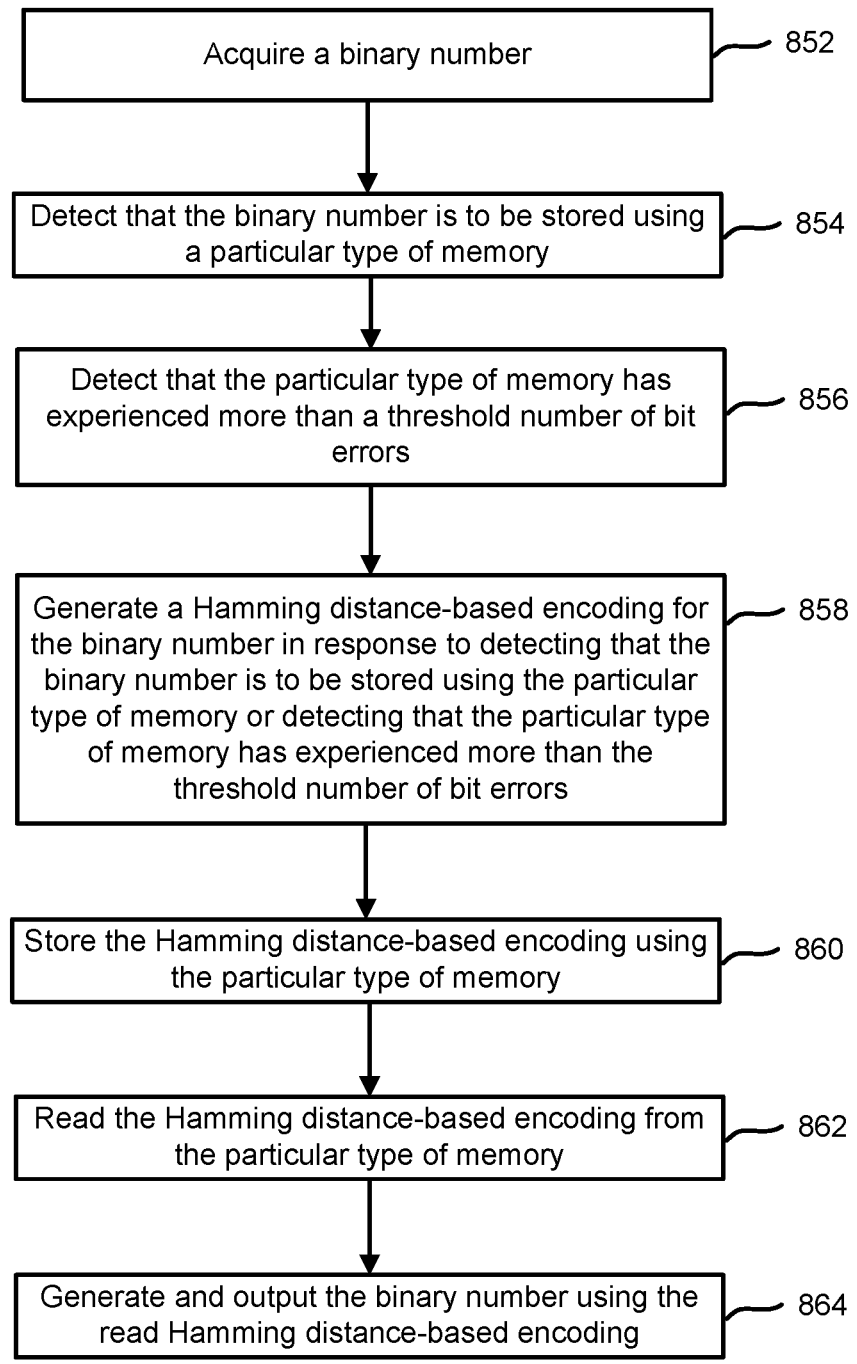

FIG. 13 depicts one embodiment of a method for writing data to a semiconductor memory and reading data from the semiconductor memory.

DETAILED DESCRIPTION

Technology is described for dynamically encoding and decoding binary numbers using linear-time algorithms that encode and decode Hamming Distance-Based representations for the binary numbers. The binary numbers may correspond with integer values, such as 64-bit, 128-bit, or 256-bit integer values. In some cases, in response to detecting that a binary number is to be stored using a particular type of memory (e.g., a phase change memory), detecting that the particular type of memory has at least a threshold number of defects (e.g., that the memory has at least ten word line failures), or detecting that data previously written to or read from the particular type of memory has experienced at least a threshold number of bit errors (e.g., that there have been at least five bit errors), the binary number to be stored using the particular type of memory may first be encoded using a Hamming Distance-Based representation and then the encoded data may be written to the particular type of memory. The binary number (e.g., representing an integer value) may be encoded by generating a binary string or a binary array representing the binary number such that if one bit flips within the binary string or the binary array, the maximum distortion in the number is less than a threshold amount (e.g., less than fifty).

One technical benefit of generating and storing Hamming Distance-Based representations for binary numbers is that less memory die area may be required to protect stored data from bit errors. For example, ECC circuitry may not be necessary to protect the stored data. Moreover, the ability to dynamically generate and store the Hamming Distance-Based representations for binary numbers (e.g., based on a history of bit errors for a semiconductor memory or a memory block within the semiconductor memory) may improve the overall read and write performance for the semiconductor memory as the Hamming Distance-Based representations for the binary numbers may only be generated and stored when necessary or when particular bit error conditions are detected.

Figure 1:
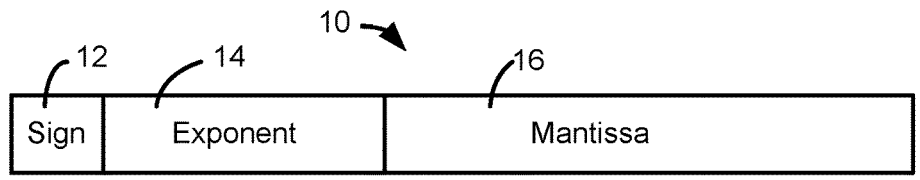
FIG. 1 is a conventional binary representation of a floating-point number.

A weakness of some techniques for representing numbers as a binary string is that a single bit error in the binary string may lead to a very large distortion in the number being represented. Referring to the case in which the floating point representation of FIG. 1 is used, if the most significant bit in the exponent 14 were to be flipped, the floating-point number could change from about the maximum floating-point number to almost the lowest floating-point number (in absolute value) that can be represented. For example, if the exponent has 11 bits, then the number could be flipped from about $2^{1023}$ to $2^0$ (assuming a 1 to 0 flip of the most significant bit in the exponent). Other bit flips can also lead to very large changes in the floating-point number being represented by the bit string.

When the encoded bit strings are stored to memory, there is a small, but finite probability that reading back the bit string does not result in the same information that was intended to be stored therein. For example, some memory cells may be programmed to one of two or more data states based on a charge stored in a charge storage region of the memory cell. The memory cell may comprise a memory cell transistor, with the amount of charge controlling the threshold voltage of the memory cell transistor. Over time the amount of charge stored in the memory cell can change, resulting in a change in the threshold voltage of the memory cell transistor. As another example, some memory cells may be programmed to one of two or more data states based on the resistance of a memory cell and over time the resistance of the memory cell may change. In either case, the data state being stored by the memory cell may change resulting in a "bit flip" or a "bit error." The memory cell may comprise one memory cell out of a plurality of memory cells within a memory array.

In some embodiments, the memory array may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide). In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading and/or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) memory cells. In other cases, the re-writeable non-volatile memory cells may comprise conductive bridge memory cells or programmable metallization memory cells.

In some embodiments, binary strings that represent numbers in an interval [a, b) are clustered based on Hamming weights. For example, $2^n$ binary strings may be placed into n+1 groups that are ordered based on their Hamming weights. Each of the groups may contain binary strings with the same Hamming weight. In one embodiment, numbers in an interval assigned to one of $2^n$ sub-intervals. For example, the numbers may be uniformly quantized into one of $2^n$ sub-intervals. For example, floating point numbers in the interval [a, b) may be uniformly quantized into $2^n$ sub-intervals in the interval [a, b). These $2^n$ sub-intervals (or bins) may be mapped to the $2^n$ binary strings that are ordered across the interval in accordance with Hamming weight. Thus, the numbers may be assigned to one of the $2^n$ binary strings. Doing so may reduce the distortion in the number in the event that there is a bit flip in the assigned binary string. Note that the distortion may be defined relative to the size of the interval [a, b). For example, if the interval is [0, 1), then an error of 0.5 due to a bit flip may be defined as a 50 percent distortion.

In one embodiment, the binary strings may be stored to memory without using ECC or, alternatively, with using fewer redundant bits for ECC. There may be some chance that there will be a bit flip in a binary string, but some applications may be able to tolerate such bit flips, providing that the maximum and/or average distortion due to a bit flip is less than a certain percentage of the interval.

Figure 2A:
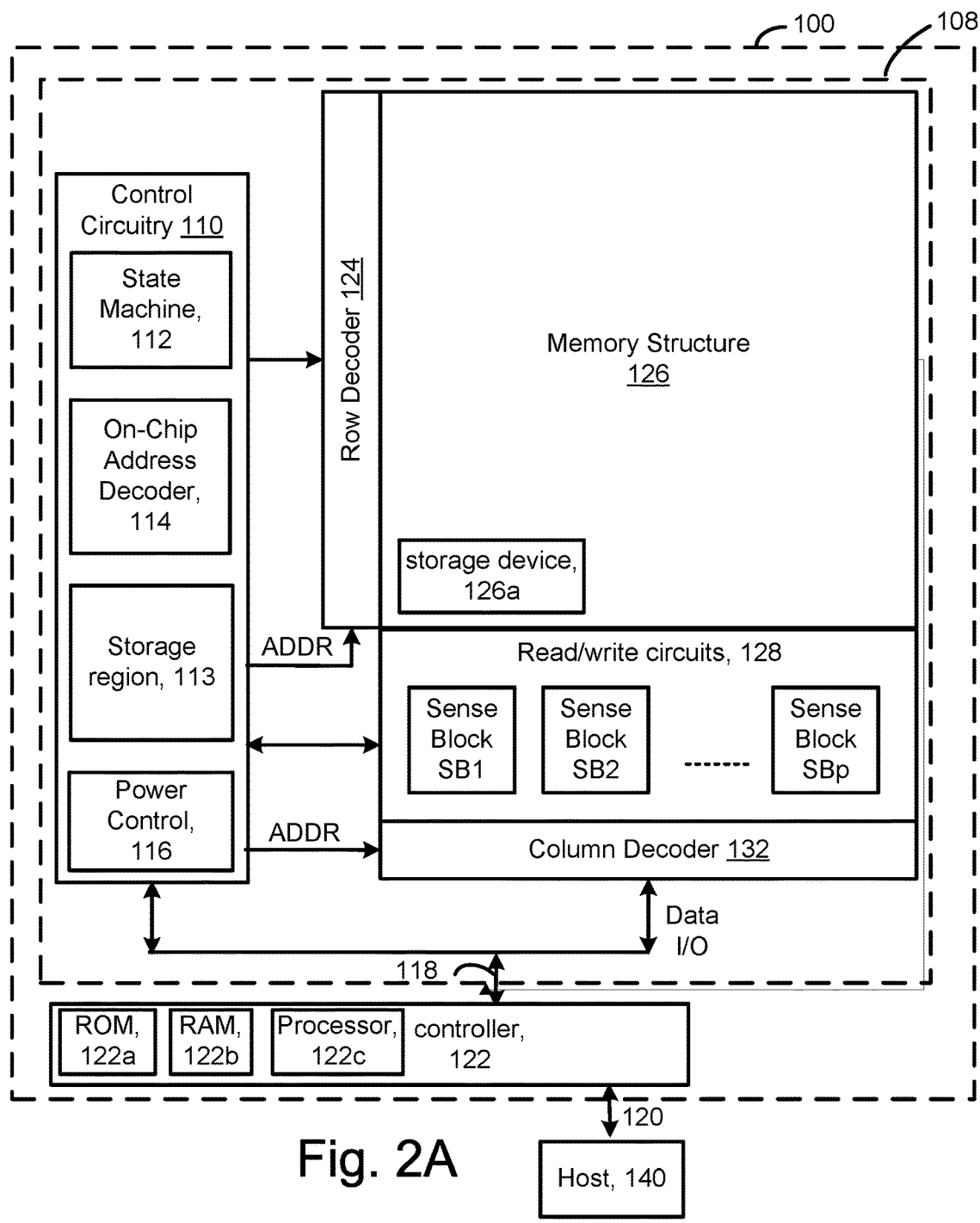
FIG. 2A is a functional block diagram of a memory device in which embodiments may be practiced.

Technology described herein may be used with a variety of types of memory systems. However, it will be appreciated that technology described herein is not limited to memory systems. FIG. 2A is a functional block diagram of a memory device in which embodiments may be practiced. The memory system 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory system 100 (e.g., a removable storage card) as the one or more memory die 108. Commands and data are transferred between the host 140 and controller 122 via a data bus 120 and between the controller and the one or more memory die 108 via lines 118.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for parameters for operating the memory device such as programming parameters for different rows or other groups of memory cells. These programming parameters could include bit line voltages and verify voltages. The one or more state machines, page registers, SRAM, and control circuitry within the control circuitry 110 for controlling the operation of the memory chip may be referred to as managing or control circuits. The managing or control circuits may facilitate one or more memory array operations including forming, erasing, programming, or reading operations. The on-chip address decoder 114 provides an address interface between that used by the host or a memory controller to the hardware address used by the decoders 124 and 132. The power control module 116 controls the power and voltages supplied to the word lines and bit lines during memory operations. It may include drivers for word line layers (WLLs) in a 3D configuration, SGS and SGD select gates and source lines. The sense blocks can include bit line drivers, in one approach. An SGS select is a gate transistor at a source-end of a NAND string, and an SGD select gate is a transistor at a drain-end of a NAND string.

In some embodiments, the control circuitry 110 may comprise a representative example of means for generating a Hamming distance-based encoding for a binary number and/or means for encoding a binary number such that if one bit flips within the resulting encoded data that the maximum distortion in the binary number is less than a threshold amount (e.g., less than ten).

In some embodiments, the controller 122 may comprise a representative example of means for acquiring a binary number (e.g., from a host), means for generating a Hamming distance-based encoding for the binary number, and/or means for encoding a binary number such that if one bit flips within the resulting encoded data that the maximum distortion in the binary number is less than a threshold amount.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SB1, SB2, . . . , SBp, read/write circuits 128, controller 122, and so forth.

The off-chip controller 122 may comprise a processor 122c and storage devices (memory) such as ROM 122a and RAM 122b. The storage devices comprises code such as a set of instructions, and the processor is operable to execute the set of instructions to provide functionality described herein. Alternatively or additionally, the processor can access code from a storage device 126a of the memory structure, such as a reserved area of memory cells in one or more word lines.

The code is used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports. In some embodiments, the controller 122 encodes floating point numbers into binary strings. The controller 122 along with control circuitry 110, and read/write circuits 128 may store the binary strings in the memory array 126.

Other types of non-volatile memory in addition to NAND flash memory can also be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

Figure 2B:
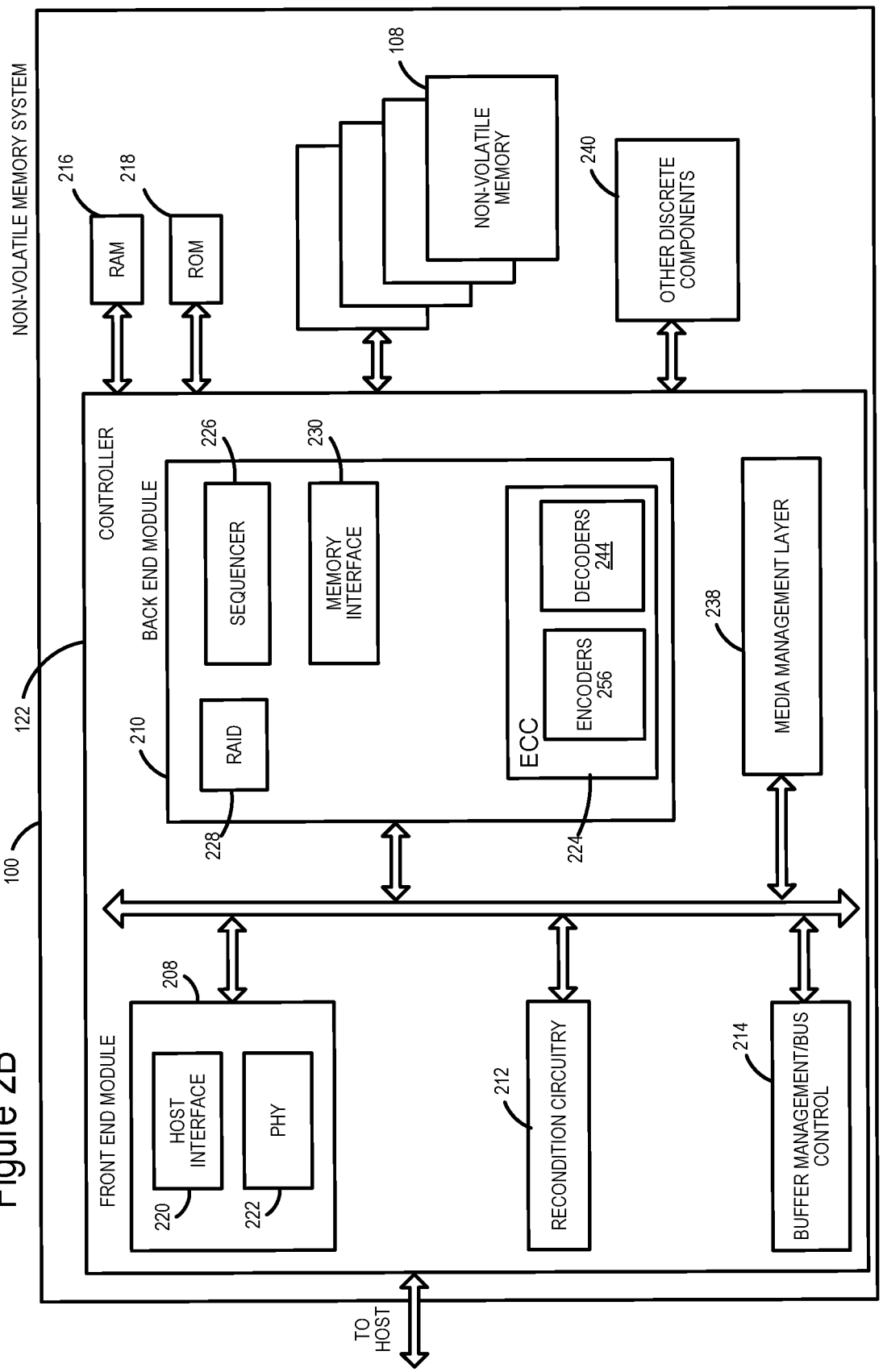
FIG. 2B is a block diagram of example memory system, depicting more details of Controller.

FIG. 2B is a block diagram of example memory system 100, depicting more details of controller 122. In one embodiment, the system of FIG. 2B is a solid state drive. As used herein, a memory controller is a device that manages data stored on memory and communicates with a host, such as a computer or electronic device. A memory controller can have various functionality in addition to the specific functionality described herein. For example, the memory controller can format the flash memory to ensure the memory is operating properly, map out bad memory cells, and allocate spare memory cells to be substituted for future failed cells. Some part of the spare cells can be used to hold firmware to operate the flash memory controller and implement other features. In operation, when a host needs to read data from or write data to the memory, it will communicate with the memory controller. If the host provides a logical address (LA) to which data is to be read/written, the memory Controller can convert the logical address received from the host to a physical address in the memory. The memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface. In one embodiment, memory system 100 may be a card based system, such as a secure digital (SD) or a micro secure digital (micro-SD) card. In an alternative embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2B, controller 122 includes a front end module 208 that interfaces with a host, a back end module 210 that interfaces with the one or more non-volatile memory die 108, and various other modules that perform functions which will now be described in detail.

The components of controller 122 depicted in FIG. 2B may take the form of a packaged functional hardware unit (e.g., an electrical circuit) designed for use with other components, a portion of a program code (e.g., software or firmware) executable by a (micro)processor or processing circuitry (or one or more processors) that usually performs a particular function of related functions, or a self-contained hardware or software component that interfaces with a larger system. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include or comprise software stored in a processor readable device (e.g., memory) to program a one or more processors for controller 122 to perform the functions described herein. The architecture depicted in FIG. 2B is one example implementation that may (or may not) use the components of controller 122 depicted in FIG. 2B (i.e. RAM, ROM, processor).

Controller 122 may include recondition circuitry 212, which is used for reconditioning memory cells or blocks of memory. Referring again to modules of the controller 122, a buffer manager/bus Controller 214 manages buffers in random access memory (RAM) 216 and controls the internal bus arbitration of controller 122. A read only memory (ROM) 218 stores system boot code. Although illustrated in FIG. 2B as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

The front end module 208 contains non-transitory storage, in one embodiment. The non-transitory storage may be volatile or non-volatile. For example, the non-transitory storage could include, but is not limited to, buffers, registers, and RAM. The non-transitory storage is used to store digital representation of numbers received from host, in one embodiment. For example, the host may send floating point numbers, which can be stored in non-transitory storage in front end module 208. Note that the digital representation of numbers received from host can be stored in non-transitory storage elsewhere in controller 122.

Back end module 210 includes an error correction controller (ECC) engine 224 that encodes the data bytes received from the host, and decodes and error corrects the data bytes read from the non-volatile memory. The ECC engine 224 has one or more decoders 244 and one or more encoders 256. In one embodiment, the ECC engine 224 comprises a low-density parity check (LDPC) decoder. In one embodiment, the decoders 244 include a hard decoder and a soft decoder. An output of the one or more decoders 244 may be provided to the host.

In one embodiment, the ECC engine 224 encodes floating-point numbers or integer numbers to binary strings, as described herein. Note that the ECC engine 224 does not necessarily add error correction codes to the binary strings, but that is one possibility. The ECC engine 224 may also decode bit strings back to floating-point numbers. The ECC engine 224 contains non-transitory storage, in one embodiment. The non-transitory storage may be volatile or non-volatile. For example, the non-transitory storage could include, but is not limited to, buffers, registers, and RAM. The non-transitory storage in the ECC engine 224 is used to store the binary strings and the floating-point numbers, in one embodiment. Note that the binary strings and the floating point numbers can be stored in non-transitory storage elsewhere in the controller 122. For example, the floating-point numbers and binary strings can be stored in RAM 216 to, for example, facilitate the encoding and decoding processes as described herein.

A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface.

Additional components of system 100 illustrated in FIG. 2B include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Media Management Layer (MML) 238 may be integrated as part of the management that may handle errors and interfacing with the host. In one embodiment, MML 238 is a flash translation layer. In particular, MML may be responsible for the internals of NAND management. In particular, the MML 238 may include an algorithm in the memory device firmware which translates writes from the host into writes to the memory of die 108. The MML 238 may be needed because: 1) the memory may have limited endurance; 2) the memory may only be written in multiples of pages; and/or 3) the memory may not be written unless it is erased as a block. The MML 238 understands these potential limitations of the memory which may not be visible to the host. Accordingly, the MML 238 attempts to translate the writes from host into writes into the memory.

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, etc. Additionally, the SSD need not be made to work as a hard drive.

FIG. 3 depicts a table 300 showing a way of mapping numbers to binary strings. In this example, the numbers may be floating-point numbers. In table 300, there are 16 binary strings. The number space may be numbers in the interval [0, 1). For example, the number space could be all real numbers in the interval [0, 1). Note that the numbers may be assigned to 16 sub-intervals. For example, table 300 contains a set of floating-point numbers [0.0, 0.0625, . . . 0.9375}. This set contains 16 values, which may be referred to as "indices."

The binary strings in table 300 are ordered in accordance with their binary value. Each floating-point number in the set is mapped to one binary string. For example, the floating point value "0.0" is mapped to the binary string "0000," the floating point value "0.0625" is mapped to the binary string "0001."

Two of the values in each column in table 300 are circled to illustrate the impact of a single bit flip in the binary string. If the value of "1111" were to change to "0111," this means that the floating-point number that is represented changes from 0.9375 to 0.4375. This represents a 50 percent change within the interval [0, 1). This change (or error) is referred to herein as a "distortion." Hence, a single bit flip can lead to a very high distortion. There are other cases which can also have a 50 percent distortion. For example, if the value of "0010" were to change to "1010", this means that the floating-point number that is represented changes from 0.125 to 0.625. This again represents a 50 percent change of the interval. Hence, a single bit flip can lead to a very high distortion.

Another observation is that even if more bits are used for the binary string, the distortion is not reduced. For example, consider the case if 32 bits are used for the binary string. In this case, if the most significant bit of the binary string flips, this again results in essentially a 50 percent distortion.

FIG. 4 is a table 400 to illustrate one embodiment of mapping numbers to binary strings. A "binary string" could also be referred to as a "binary vector." In this example, the table 400 has 16 binary strings. The number space is the interval [0, 1). The number space could be all real numbers in the interval [0, 1). However, the number space does not need to contain all real numbers in the interval [0, 1). Numbers in the interval [0, 1) may be uniformly quantized to 16 sub-intervals, in accordance with one embodiment. These 16 sub-intervals may correspond to the 16 binary strings. Stated another way, table 400 depicts one possible mapping of sub-intervals to binary strings. The mapping can be used to map floating point numbers to binary strings. For example, the mapping could be used to map a binary representation of a floating point number in accordance with the IEEE 754 standard into a binary string. Note that the mapping in table 400 is quite simple in that there are only four bits in each string. As will be explained below, using more bits in the binary strings can reduce the average distortion.

In table 400, the binary strings may be ordered in accordance with their Hamming weights. This, in effect, orders the binary strings across the interval [0, 1) in accordance with their Hamming weights. In table 400, the binary string with a Hamming weight of zero is first. By "first" it is meant that it is the first binary string at the lower end of the interval [0, 1). Next in the order are all of the binary strings with a Hamming weight of one (e.g., 0001, 0010, 0100, 1000). Next in the order are all of the binary strings with a Hamming weight of two (e.g., 0011, 0101, 0110, 1001, 1100). Next in the order are all of the binary strings with a Hamming weight of three (e.g., 0111, 1011, 1101, 1110). Next in the order is the binary string with a Hamming weight of four (1111). Thus, the last binary string at the higher end of the interval [0, 1). Also note that when ordering binary string according to Hamming weights, those binary strings with the same Hamming weight may be clustered in the same group. Herein, such a group is referred to as a Hamming group.

Two of the entries in each column are circled to illustrate the impact of a single bit flipping. If the value of "1111" were to change to "0111", this means that the floating point number that is represented changes from 0.9375 to 0.6875. This represents a 25% change relative to the size of the interval. Hence, a single bit flip leads to a lower distortion than in the similar case for the representation of FIG. 3. There are other cases which can also benefit. For example, if the value of "0010" were to change to "1010", this means that the floating point number that is represented changes from 0.125 to 0.5625. This represents a 43.72 percent change of relative to the size of the interval. Hence, there is also some improvement relative to the representation of FIG. 3. Note that there will not necessarily be improvement for all cases. However, using more bits for the binary strings can reduce the average distortion. Also, using more bits for the binary strings can reduce the maximum distortion. Since, typically many more than four bits will be used for the binary strings, the average and maximum distortion can be improved significantly relative to the representation of FIG. 3.

Also note that the floating point representation of FIG. 1 also suffers from the problem that using more bits might not reduce the average or maximum distortion. For example, if the exponent has 11 bits, then the value that is represented can change from about $2^{1023}$ to $2^0$ (assuming a 1 to 0 flip of the most significant bit in the exponent). If the exponent has 8 bits, then the value that is represented could change from about $2^{127}$ to $2^0$ (assuming a 1 to 0 flip of the most significant bit in the exponent). Note that relative to the size of the numbers in the interval, the distortion does not go down when using more bits for the exponent.

Figure 5A:
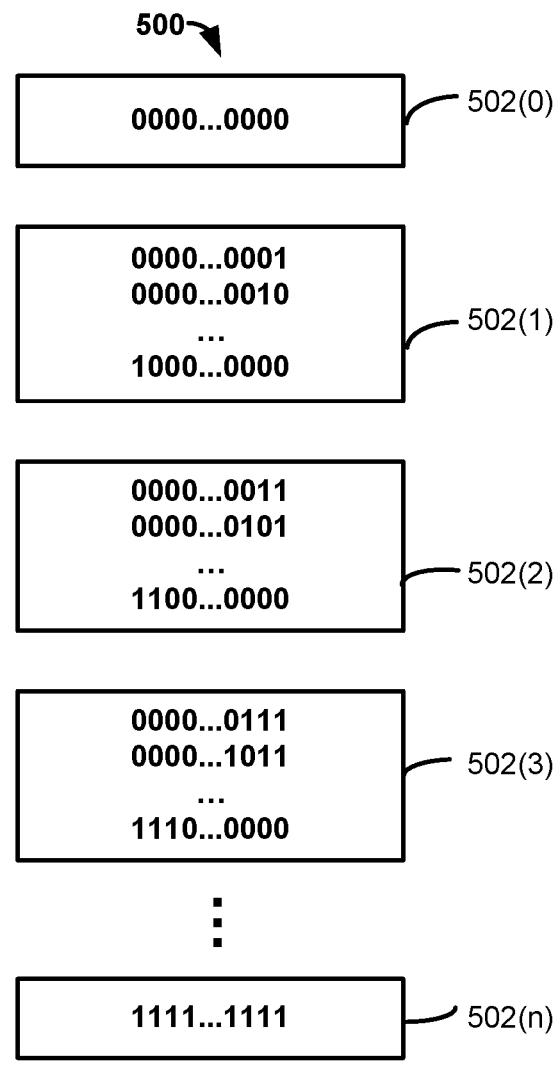
FIG. 5A depicts one embodiment of clustering binary strings into groups in accordance with their Hamming weights.

FIG. 5A depicts one embodiment of clustering 500 binary strings into Hamming groups 502 in accordance with their Hamming weights. In one embodiment, the set of binary strings using for mapping includes all $2^n$ binary strings of length "n". Depending on the implementation, "n" might be 16, 32, 64, 128, or some other value. The binary strings have at least eight bits in this example. The binary strings are clustered into n+1 Hamming groups 502(0)-502($n$). Hamming group 502(0) contains all of the binary strings of length n having a Hamming weight of 0. Hamming group 502(1) contains all of the binary strings of length n having a Hamming weight of 1. Hamming group 502(2) contains all of the binary strings of length n having a Hamming weight of 2. Hamming group 502(3) contains all of the binary strings of length n having a Hamming weight of 3. Hamming group 502($n$) contains all of the binary strings of length n having a Hamming weight of n. Other Hamming groups 502 are not depicted so as to not obscure the diagram.

Note that in FIG. 5A, the binary strings are clustered based on Hamming weight (e.g., the number of ones). This is one example of clustering based on a Hamming distance to a base binary string of length "n." When the base binary string is all zeros, the clustering is based on Hamming weight. However, the clustering could be performed relative to another base binary string, such as the string of all ones. Herein, a "Hamming group" is defined as a group of binary strings each of length "n" that each have the same Hamming distance to a base binary string of length "n."

Continuing on with the discussion of FIG. 5A, note that a bit flip of one bit corresponds to a change from one Hamming group 502 to an adjacent Hamming group. For example, a bit flip of one bit of any of the binary strings in Hamming group 502(2) would place the binary string into either Hamming group 502(1) or Hamming group 502(3). Also note that if there are more bits in the binary strings, then there will be more Hamming groups. For example, there are n+1 Hamming groups 502 for strings of length n. Having more Hamming groups, in effect, tends to reduce the distortion in the event of a bit flip.

Figure 5B:
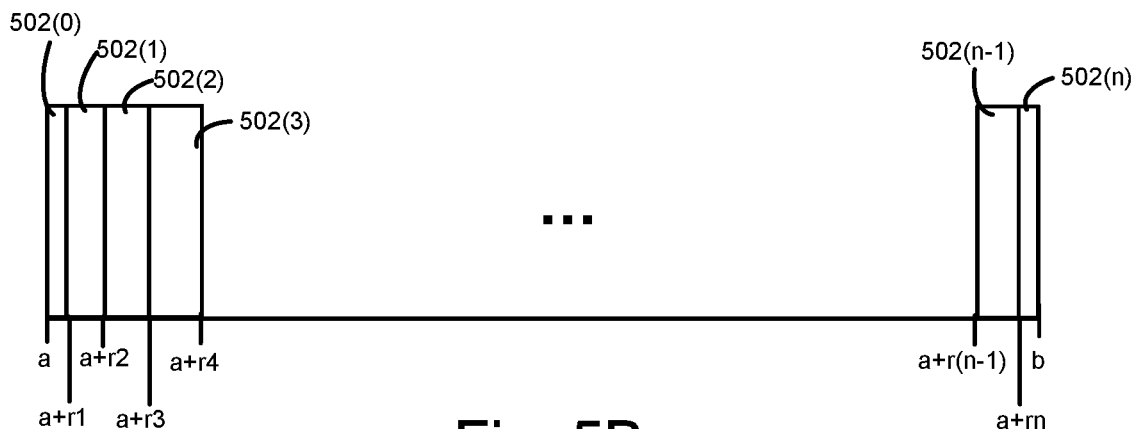
FIG. 5B is a diagram to illustrate a mapping of numbers in the interval [a, b) to binary strings.

FIG. 5B is a diagram to illustrate a mapping of numbers in the interval [a, b) to binary strings. In one embodiment, the interval is for real numbers in [a, b). In one embodiment, the interval is for floating point numbers in [a, b). The interval is represented by the x-axis and is divided into n+1 sub-intervals, several of which are labeled (not all sub-intervals are depicted). The sub-intervals include [a, a+r1), [a+r1, a+r2), [a+r2, a+r3), [a+r3, a+r4), . . . [a+r(n−1), a+rn), [a+rn, b). Each of these sub-intervals corresponds to one Hamming group 502 of binary strings. For example, sub-interval [a, a+r1) corresponds to Hamming group 502(0), sub-interval [a+r1, a+r2) corresponds to Hamming group 502(1), etc. In one embodiment, the system maps numbers in a sub-interval to some binary string in the corresponding Hamming group 502. Note that as there are more Hamming groups 502, this can help to partition the interval into more sub-intervals. This can help to reduce the distortion in the event of a bit flip in a binary string.

FIG. 6A is a flowchart of one embodiment of a process 600 of mapping a number to a binary string. The process 600 may use Hamming groups, as in the examples of FIGS. 4, 5A and 5B, but is not limited to those examples. The process 600 may be performed by a control circuit in the memory system 100, but is not limited to memory system 100. In one embodiment, process 600 has zero storage overhead. For example, the binary strings may be stored without any redundant bits (e.g., ECC). In one embodiment, the number to be mapped is within an interval [a, b). Note that process 600 may be repeated to encode other numbers within the interval [a, b). In one embodiment, the number(s) is/are within the interval [0, 1). Such an interval may be useful for applications such as weights in a machine learning algorithm. However, a different interval may be used.

Step 602 includes accessing a representation of a number. In one embodiment, this is a digital representation of a number. The number may be a floating point number, but is not required to be a floating point number. For example, the memory system 100 may access a floating point number that is represented in accordance with the IEEE 754 standard for representing floating point numbers. As is well-known, the representation of the floating point number could be a string of bits. Note that step 602 is not limited to the floating point number being represented by the IEEE 754 standard.

Step 604 includes assigning the number to one of $2^n$ sub-intervals. These $2^n$ sub-intervals are non-overlapping and cover the entire interval [a, b), in one embodiment. The $2^n$ sub-intervals may be ordered from one end of the interval to the other end of the interval. In one embodiment, floating point numbers are uniformly quantized into the $2^n$ sub-intervals. Thus, step 604 may include quantizing one floating point number to one of the $2^n$ sub-intervals.

Step 606 includes mapping the number from the assigned $2^n$ sub-interval to a binary string from a set of $2^n$ binary strings that are ordered across the interval [a, b) in accordance with their distance to a base binary string of length n. In one embodiment, the base binary string has all zeros. Thus, the step 606 may include mapping the number from the assigned $2^n$ sub-interval to a binary string from a set of $2^n$ binary strings that are ordered across the interval [a, b) in accordance with their Hamming weights.

Note that the mapping of step 606 may link each of the $2^n$ binary strings to one of the $2^n$ sub-intervals. In one embodiment, the binary strings each have a length of "n". In one embodiment, the set of binary strings comprise all binary strings of length "n". For example, there are $2^n$ binary strings having length "n". In one embodiment, the binary strings have n+1 different Hamming distances to the base string. In one embodiment, the binary strings have n+1 different Hamming weights. Thus, the $2^n$ binary strings may be said to comprise n+1 Hamming groups, each of which comprises only binary strings with the same Hamming distance to the base string. In one embodiment, the $2^n$ binary strings comprise n+1 Hamming groups, each of which comprises only binary strings with the same Hamming weight.

Note that steps 604 and 606 may be performed by hardware for fast encoding. For example, steps 604 and 606 may be implemented within or by an application specific integrated circuit (ASIC), a Field Programmable Gate Array (FPGA), a circuit, a digital logic circuit, an analog circuit, a combination of discrete circuits, gates, or any other type of hardware or combination thereof.

Step 608 includes storing the binary string in non-transitory storage. In one embodiment, the binary string is stored in memory 126. The non-transitory storage may include non-volatile storage (e.g., NAND, NOR, ReRAM) or volatile storage (e.g., RAM). The binary string may be stored with other binary strings that represent other floating point numbers. In one embodiment, the system stores the binary string in non-volatile storage. For example, controller 122 may transfer the binary string to memory die 108, which stores the binary string in memory array 126 (see FIG. 2A). In one embodiment, the system does not use any error correction codes when storing the binary string in memory. Thus, the binary string can be stored (along with other binary strings) without any storage overhead. However, some error correction codes could be used. In one embodiment, the system uses a less robust ECC than might be used to store other data. For example, the system might use fewer redundant bits per page when storing binary strings encoded by process 600, than other data into memory array 126.

Note that even if one of the bits in the binary string should flip, the amount of distortion in the number represented by the bit string remains relatively low due to the encoding technique. For some applications, a small amount of distortion may be tolerable. Hence, the system can use less storage, while still staying within a tolerable amount of distortion for a given application.

Furthermore, note that the bit flip might occur during storage or during transmission to or from the storage. Thus, in one embodiment, the system over-clocks the memory when writing and/or reading the binary string(s) to/from memory. Over-clocking the memory may increase the risk that a bit will be flipped during transmission. However, as noted, a small amount of distortion may be tolerable for some applications. Hence, process 600 may allow for over-clocking of the memory, while still staying within a tolerable amount of distortion for a given application.

In one embodiment, the binary strings are ordered within a given Hamming group 502 in accordance with their binary values. For example, if there are eight bits per string, the binary strings having a Hamming weight of one may be ordered (00000001, 00000010, . . . 10000000). FIG. 6B is a flowchart of one embodiment of a process 650 of how quantized numbers may be mapped to binary strings. Here, a quantized number refers to one that has been quantized to one of $2^n$ sub-intervals in the interval referred to in process 600. The process 650 assumes that the binary strings are ordered within a given Hamming group 502 in accordance with their binary values. The process 650 may be used as one embodiment of step 606 in process 600.

Process 650 may be performed by hardware for fast encoding. For example, process 650 may be implemented within or by an application specific integrated circuit (ASIC), a Field Programmable Gate Array (FPGA), a circuit, a digital logic circuit, an analog circuit, a combination of discrete circuits, gates, or any other type of hardware or combination thereof.

In step 652, the quantized number is assigned to a Hamming group 502. There may be n+1 Hamming groups 502, assuming there are $2^n$ binary strings of length n. This step may include any technique for assigning a quantized number with a Hamming group 502. In one embodiment, the quantized number is first assigned an index based on its location within the interval. This may equate to assigning an index based on which of n+1 non-overlapping sub-intervals that the quantized number resides in.

In step 654, the quantized number is encoded in accordance with values of binary strings in the Hamming group 502. In one embodiment, there is a one-to-one mapping between quantized number in the sub-interval and binary strings in the Hamming group 502. In one embodiment, the quantized number with the lowest value in the sub-interval is mapped to the binary string having the lowest value in the Hamming group 502, the quantized floating point number with the second lowest value in the sub-interval is mapped to the binary string having the second lowest value in the Hamming group 502, etc. Thus, the quantized numbers in the sub-interval is may be encoded in accordance with values of binary strings in the corresponding Hamming group 502.

The following is a brief discussion of how using additional bits in the binary strings may reduce distortion that could result from a bit flip. For the sake of illustration, assume that there is an interval that covers all real numbers that are to be represented. For example, for a neural network, the interval might need to be [0, 1) to cover the weights used in the neural network. However, this interval is just one example. This interval may be broken into sub-intervals, which may correspond to a uniform quantization of the interval of real numbers. For the sake of illustration, the set of indices $\{0, 1, \ldots 2^n-1\}$ may represent this uniform quantization of the interval of real numbers.

Thus, an assumption may be made that there is a set of $2^n$ floating point numbers (e.g., the quantized real numbers in the interval) that are to be represented in binary form. Note that if there are other floating point numbers in a given one of the $2^n$ sub-intervals, they may be quantized to one representative floating point number to produce the set of $2^n$ floating point numbers. For example, referring back to FIG. 4, there is a set of $2^4$ floating point numbers in the table 400. Also note that the binary strings each have "n" bits.

A one-to-one mapping may be created between the $2^n$ floating point numbers and $2^n$ binary strings (each having "n" bits). For example, referring back to FIG. 4, the $2^4$ floating point numbers in the table map to the $2^n$ binary strings each having "n" bits.

A distortion (d) of a pair of binary strings ($b_1$, $b_2$) for a given mapping (f) may be defined in terms of a 1-norm distance of the floating point numbers over the whole interval of floating point numbers, as in Equation 1. Note that "f" represents the mapping from the floating point numbers to the binary strings.

$$d(f, b_1, b_2) = \frac{|f(b_1) - f(b_2)|}{2^n}, b_1, b_2 \in \{0, 1\}^n \quad (1)$$

For a given binary string, there may be a different distortion, depending on which bit in the binary string flips. The distance-1 distortion of one binary string (b) may be defined as in Equations 2 and 3. A "distance-1" distortion refers to exactly one bit in the binary string flipping.

Equation 2 is for the maximum "distance-1" distortion for a binary string. That is, it is for the case that represents the bit flip that results in the maximum distortion. Equation 3 is for the average "distance-1" distortion for a binary string. That is, it is for case that represents the average distortion of the all possible one-bit flips.

$$d_{1,max}(f, b) = \max_{d_H(b,x)=1} d(f, b, x) \qquad (2)$$

$$d_{1,ave}(f, b) = \frac{\sum_{x, d_H(b,x)=1} d(f, b, x)}{n} \qquad (3)$$

A distortion of all of the binary strings in the set of $2^n$ binary strings may be computed from Equations 2 and 3. The distance-1 distortion of a mapping f may be defined as in Equations 4 and 5. Equation 4 is for the maximum distance-1 distortion for the mapping f. Equation 5 is for the average distance-1 distortion for the mapping f.

$$d_{1,max}(f) = \max_{b \in \{0,1\}^n} d_{1,max}(f, b) \qquad (4)$$

$$d_{1,ave}(f) = \sum_{b \in \{0,1\}^n} d_{1,ave}(f, b)/2^n \qquad (5)$$

Embodiments disclosed herein provide for a mapping such that $d_{1,max}(f)$ in Equation 4 is within a tolerance of an application (such as, but not limited to, a machine learning algorithm). Moreover, embodiments disclosed herein provide for a mapping in which $d_{1,max}(f)$ becomes smaller as the number of bits used in the bit strings is larger. Embodiments disclosed herein provide for a mapping such that $d_{1,ave}(f)$ in Equation 5 is within a tolerance of an application (such as, but not limited to, a machine learning algorithm). Moreover, embodiments disclosed herein provide for a mapping in which $d_{1,ave}(f)$ becomes smaller as the number of bits used in the bit strings is larger.

The cases in which more than one bit flips may also be considered. Herein, a "distance-k distortion" refers to "k" bits flipping in a single binary string. A distance-k distortion may be defined in a similar manner, as Equations 4 and 5 above. Equation 6 is for the maximum distance-k distortion. It may be seen that the maximum distance-k distortion is the maximum distance-1 distortion from Equation 4 multiplied by "k". Equation 7 is for the average distance-k distortion. It may be seen that the average distance-k distortion is the average distance-1 distortion from Equation 5 multiplied by "k".

$$d_{k,max}(f) \leq k d_{1,max}(f), \qquad (6)$$

$$d_{k,ave}(f) \leq k d_{1,ave}(f) \qquad (7)$$

Embodiments disclosed herein provide for a mapping such that $d_{k,max}(f)$ in Equation 6 is within a tolerance of an application (such as, but not limited to, a machine learning algorithm). Moreover, embodiments disclosed herein provide for a mapping in which $d_{k,max}(f)$ becomes smaller as the number of bits used in the bit strings is larger. Embodiments disclosed herein provide for a mapping such that $d_{k,ave}(f)$ in Equation 7 is within a tolerance of an application (such as, but not limited to, a machine learning algorithm). Moreover, embodiments disclosed herein provide for a mapping in which $d_{k,ave}(f)$ becomes smaller as the number of bits used in the bit strings is larger.

As noted, in some embodiments, all binary strings of length n are ordered by their Hamming weights. This may result in $2^n$ binary strings sorted into n+1 groups with the same Hamming weights. Herein, such groups may be referred to as "Hamming groups." When 1 bit error occurs, the binary string can only go to the adjacent Hamming group. The maximum distortion in one embodiment for Hamming group k is then given by Equation 8.

$$\left(\binom{n}{k} + \binom{n}{k \pm 1}\right)/2^n \qquad (8)$$

From Equation 9, it may be seen that the value is maximized when k=n/2.

$$\lim_{n \to \infty} d_{1,max}(f) \leq \lim_{n \to \infty} \frac{\left(\binom{n}{n/2} + \binom{n}{n/2 \pm 1}\right)}{2^n} = \lim_{n \to \infty} \frac{2\sqrt{\frac{2}{\pi n}} 2^n}{2^n} = \lim_{n \to \infty} 2\sqrt{\frac{2}{\pi n}} = 0 \qquad (9)$$

Equation 9 shows that as "n" goes to infinity the maximum distance-1 distortion goes to zero. Of course, in a real world application, "n" cannot go to infinity. However, as "n" becomes larger, the maximum distance-1 distortion decreases. In real world applications, it is quite practical to have "n" equal to 64, 128, or even a larger number. With "n" equal to 64, the maximum distance-1 distortion may be within tolerable limits for many applications. For example, the maximum distance-1 distortion may be about 19 percent. For example, the maximum distance-1 distortion may be about 19% of the interval being covered. With "n" equal to 64, the average distance-1 distortion may be about 7 percent, which may be within tolerable limits for many applications. For some applications, even with a lower value of "n" (such as 32), the maximum distance-1 distortion and the average distance-1 distortion may be within tolerable limits. If a tighter tolerance is desired, a larger value of "n" may be used.

FIGS. 7-8 are diagrams to illustrate a possible distortion in a mapping of floating point numbers to binary strings, in which n=16. That is, each binary string contains 16 bits. These diagrams are for purpose of illustration. The distortion may be considerably less if n is larger than 16.

FIG. 7 shows the average distortion versus binary string for "n" equal to 16. The y-axis represents the average distortion for a given binary string. Recall that for a given binary string there are multiple possible distortions, depending on which bit is flipped. The x-axis represents the distortion for the binary strings. The scale refers to normalized floating point values in the interval [0, 1) to which the binary strings map. The average distortion tends to be higher in the middle of the interval. This may be due to the Hamming groups in the middle having more binary strings. For example, there may be more binary strings with the same Hamming weight in the middle of the interval than at the ends of the interval.

FIG. 8 shows the maximum distortion versus binary string for "n" equal to 16. The y-axis represents the maximum distortion for a given binary string. The x-axis represents the distortion for the binary strings. The scale refers to normalized floating point values in the interval [0, 1) to which the binary strings map.

FIG. 9 is a diagram of one embodiment of a system 900 that is configured to encode/decode between floating point numbers and binary strings. In some cases, the system 900 may be configured to encode/decode between binary numbers and encoded binary strings. The system includes quantizer number accesser 901, quantizer 902, mapper 904, write circuit 906, read circuit 910, and demapper 914. Also depicted is a memory array 126 into which the binary strings may be stored and read back from. For the sake of discussion, the binary strings each have "n" bits.

The number accesser 901 is configured to access a digital representation of a floating point number which may be represented in, for example, the IEEE 754 standard. In one embodiment, the number accesser 901 is configured to receive digital representations of numbers from host 140. The number accesser 901 is front end module (FIG. 2B, 208), in one embodiment. In one embodiment, number accesser 901 performs step 602 of process 600. The quantizer 902 may be configured to assign the floating point number to one of $2^n$ sub-intervals, in one embodiment. In one embodiment, quantizer 902 performs step 604 of process 600. In one embodiment, quantizer 902 performs step 604 of process 600.

The mapper 904 may be configured to map the quantized floating point number to a binary string. Stated another way, the mapper 904 may be configured to encode the quantized floating point number as a binary string. In one embodiment, mapper 904 performs step 606 of process 600. In one embodiment, mapper 904 performs process 650. In one embodiment, the mapper 904 may map from the sub-interval to the binary string. In one embodiment, the mapper 904 selects a binary string index for the floating point number, based on where the floating point number is within the interval. The binary string indices may correspond to Hamming groups of binary strings. Each of the Hamming groups may have binary strings of a certain Hamming distance to a base binary string. In one embodiment, each of the Hamming groups has binary strings of a certain Hamming weight. For example, in FIG. 5A, the Hamming groups 502(0)-502(n) may have indices between 0 and n. As noted, the mapper 904 may select the index based on where the floating point number is within an interval. For example, with reference in FIG. 5B, the mapper 904 may determine which sub-interval the quantized floating point number is in.

The write circuit 906 is configured to store the binary stings into the memory array 126. In one embodiment, the binary string is stored in the memory array 126 without any redundant bits. However, redundant bits could be used. The write circuit 906 could be implemented with any combination of controller 122, state machine 112, on-chip address decoder 114, power control 116, read-write circuits 128, and/or decoders 124, 132. In one embodiment, write circuit 906 performs step 608 of process 600.

The read circuit 910 is configured to read the binary stings from the memory array 126. The read circuit 906 could be implemented with any combination of controller 122, state machine 112, on-chip address decoder 114, power control 116, read-write circuits 128, and/or decoders 124, 132.

The demapper 914 may be configured to demap the binary string back to a floating point number. The demapper 914 perform the inverse of the mapping. In one embodiment, the output of the demapper 914 is one of $2^n$ floating point values. As a simple example, with reference to table 400 in FIG. 4, the decoder output one of the 16 floating point values.

In one embodiment, the quantizer 902, mapper 904, and demapper 914 are implemented within the controller 122 of memory system 100. In one embodiment, the quantizer 902, mapper 904, and demapper 914 are implemented within the ECC engine 224 of controller 122. The quantizer 902, mapper 904, and demapper 914 could be implemented with any combination of hardware and/or software. In one embodiment, the quantizer 902, mapper 904, and demapper 914 are implemented in hardware for faster encoding and decoding. For example, the quantizer 902, mapper 904, and demapper 914 may be implemented within or by an application specific integrated circuit (ASIC), a Field Programmable Gate Array (FPGA), a circuit, a digital logic circuit, an analog circuit, a combination of discrete circuits, gates, or any other type of hardware or combination thereof.

FIG. 10 depicts a table showing a mapping of 16 integers to 16 binary strings. As depicted, the integer 704 "9" maps to the binary string 702 "1010" that comprises the Hamming distance-based encoding for the integer 704. The integer 704 "9" may be represented using the binary representation "1001."

FIG. 11 depicts one embodiment of a flowchart for generating a binary number N for a Hamming distance-based encoding x. The process depicted in FIG. 11 may be performed using encoding/decoding circuitry integrated on the memory die 108 of FIG. 2A or control circuitry, such as the control circuitry 110 depicted in FIG. 2A.

Suppose that a Hamming distance-based encoding x has n number of bits and has a Hamming weight w (e.g., the Hamming distance-based encoding x has w number of ones). In the case that the Hamming distance-based encoding x is "1010," the Hamming weight w would be 2. The Hamming distance-based encoding x may be scanned from left to right (e.g., from the 0th bit x[0] to the n−1th bit x[n−1]) to search for "1"s. When the ith "1" is encountered at bit position $p_i$, the lexicographic order of N will increase by n−1−$p_i$ choose w−i; therefore, the binary number N may be generated taking as input the Hamming distance-based encoding x using Equation 10.

$$N(x) = \sum_{i=0}^{w-1} \binom{n}{i} + \sum_{i=0}^{w-1} \binom{n-1-pi}{w-i} \quad (10)$$

In step 802, all values of a choose b for a ranging from 1 to n and b ranging from 0 to a may be precomputed and stored using a volatile or non-volatile memory. In one example, the number of bits, n, may comprise 128 bits or 256 bits. In step 804, the Hamming weight w for the input Hamming distance-based encoding x and the bit positions for the "1"s in the Hamming distance-based encoding x may be determined. For the Hamming distance-based encoding x="1010," the number of bits n is 4, the Hamming weight w is 2, and the bit positions with "1"s are x[0] and x[2]. Therefore, the position of the first "1" p(0) is 0 and the position of the second "1" p(1) is 2. In step 806, a loop increment variable i and an output variable N for the decoded number to be generated may be initialized to zero. In the first loop 808, for i less than w, the output variable N gets assigned N plus n choose i and i gets incremented by one. At step 810, if i is no longer less than w, then i gets reinitialized to zero. In the second loop 812, for i less than w, the output variable N gets assigned N plus n−1−pi choose w−i and i gets incremented by one. At step 814, if i is no longer less than w, then the output variable N gets outputted as the binary number N for the Hamming distance-based encoding x.

In one example, for the Hamming distance-based encoding x="1010," the output variable N after the first loop 808 will be (4 choose 0) plus (4 choose 1)=5. The output variable N after the second loop 812 will be 5 plus (3 choose 2) plus (1 choose 1)=9 (or the binary number "1001"). In another example, for the Hamming distance-based encoding x="1001," the output variable N after the first loop 808 will be (4 choose 0) plus (4 choose 1)=5. The output variable N after the second loop 812 will be 5 plus (3 choose 2) plus (0 choose 1)=8 (or the binary number "1000").

FIG. 12 depicts one embodiment of a flowchart for generating a Hamming distance-based encoding x for a binary number N. The process depicted in FIG. 12 may be performed using encoding/decoding circuitry integrated on the memory die 108 of FIG. 2A or control circuitry, such as the control circuitry 110 depicted in FIG. 2A.

In step 832, all values of a choose b for a ranging from 1 to n and b ranging from 0 to a may be precomputed and stored using a volatile or non-volatile memory. In one example, the number of bits, n, may comprise 128 bits or 256 bits. In step 834, a binary number N is acquired (e.g., read from non-volatile memory) and a number of bits n for the binary number N is determined. Also at step 834, a Hamming weight variable w and the output array x for the Hamming distance-based encoding to be generated are initialized (e.g., set to zero).

In the first loop 836, for N minus n choose w greater than or equal to zero, the input number N is assigned N minus n choose w and the Hamming weight variable w is incremented by one. At step 838, if N minus n choose w is less than zero, then a loop increment variable i is initialized to zero. In the second loop 840, if i is equal to or greater than n, then the output array x is outputted (e.g., stored or transmitted) as the Hamming distance-based encoding x; if i is less than n and if N equals zero, then the remaining w bits of the output array x are set to "1" and the output array x is outputted; if i is less than n, if N does not equal zero, and N is greater than or equal to n−1−i choose w, then x[i] gets "1," N gets N minus n−1−i choose w, w is decremented by one, and i is incremented by one; otherwise, i is incremented by one.

In one example, for the input binary number N="1001," because 9 minus (4 choose 0) is greater than or equal to 0, the binary number N will be assigned 9 minus 1=8 (or "1000") and the Hamming weight variable w will be incremented to 1. As the updated binary number N minus (4 choose 1) is greater than or equal to 0, the binary number N will be assigned 8 minus 4=4 (or "0100") and the Hamming weight variable w will be incremented to 2. Subsequently, as the updated binary number N minus (4 choose 2) is less than 0, the loop increment variable i is initialized to zero, N remains at 4, and w remains at 2. Entering the second loop 840, as N is greater than or equal to (3 choose 2), then x[0] is assigned "1," N is assigned N minus (3 choose 2)=1 (or "0001"), w is decremented to 1, and the loop incremental variable i is incremented to 1. As the updated N is less than (2 choose 1) and not equal to zero, then the loop incremental variable i is incremented to 2. Next, as N is equal to (1 choose 1), then x[2] is assigned "1," N is assigned N minus (1 choose 1)=0 (or "0000"), w is decremented to 0, and the loop incremental variable i is incremented to 3. Finally, as N is equal to zero and w is equal to zero, the Hamming distance-based encoding x="1010" is outputted.

FIG. 13 depicts one embodiment of a method for writing data to a semiconductor memory and/or reading data from the semiconductor memory. The method may be performed using one or more managing or control circuits integrated with memory die 108 in FIG. 2A or Hamming distance-based encoding and decoding circuitry integrated with the semiconductor memory. The semiconductor memory may comprise a phase change memory or a ReRAM. The semiconductor memory may comprise a volatile memory or a non-volatile memory.

In step 852, a binary number is acquired. In one example, the binary number may comprise part of an image file or a database file to be stored using the semiconductor memory. In step 854, it is detected that the binary number is to be stored using a particular type of memory. In one example, the particular type of memory may comprise a phase change memory. In step 856, it is detected that the particular type of memory has experienced more than a threshold number of bit errors. In one embodiment, if the binary number is to be written to a phase change memory, then a Hamming distance-based encoding may be generated and stored using the phase change memory; however, if the binary number is to be written to a DRAM or SRAM, then the binary number may be written directly to the DRAM or SRAM without generating the Hamming distance-based encoding for the binary number. In another embodiment, if the particular type of memory or a memory block within the particular type of memory has experienced more than a threshold number of bit errors during previous reading or writing of data to the block or the memory, then a Hamming distance-based encoding may be generated and stored using the semiconductor memory rather than storing the binary number itself. In some cases, a flag bit may be embedded within page information associated with the binary number in order to identify that a Hamming distance-based encoding has been stored for the binary number instead of directly storing the binary number.

In step 858, a Hamming distance-based encoding for the binary number is generated in response to detecting that the binary number is to be stored using the particular type of memory and/or in response to detecting that the particular type of memory has experienced more than the threshold number of bit errors (e.g., more than three errors since a previous erasing of a memory block to which the binary number is to be written within the semiconductor memory). One method for generating a Hamming distance-based encoding for the binary number is depicted in FIG. 12. In step 860, the Hamming distance-based encoding is stored using the particular type of memory. In step 862, the Hamming distance-based encoding for the binary number is read from the particular type of memory. In step 864, the binary number is generated using the Hamming distance-based encoding for the binary number and the generated binary number is outputted (e.g., stored or transmitted). One method for generating the binary number from the Hamming distance-based encoding for the binary number is depicted in FIG. 11.

One embodiment of the disclosed technology includes a semiconductor memory and one or more control circuits. The one or more control circuits configured to acquire a first set of data associated with a binary number and detect that the semiconductor memory comprises a particular type of memory. The first set of data comprises a total number of bits. The one or more control circuits configured to generate a Hamming distance-based encoding for the first set of data in response to detection that the first set of data is to be stored using the particular type of memory. The one or more control circuits configured to detect that the binary number minus the total number of bits choose one is greater than or equal to zero and reduce the binary number by the total number of bits choose one in response to detection that the binary number minus the total number of bits choose one is greater than or equal to zero. The one or more control circuits configured to initialize a loop variable and an output array. The one or more control circuits configured to determine a Hamming weight for the first set of data. The one or more control circuits configured to detect that the reduced binary number is greater than or equal to the total number of bits minus one choose the Hamming weight for the first set of data and set a bit position within the output array corresponding with the loop variable to one in response to detection that the reduced binary number is greater than or equal to the total number of bits minus one choose the Hamming weight for the first set of data. The one or more control circuits configured to output the output array as the Hamming distance-based encoding for the first set of data and write the Hamming distance-based encoding for the first set of data to the semiconductor memory.

One embodiment of the disclosed technology includes acquiring a first set of data to be written to a semiconductor memory. The first set of data is associated with a binary number. The method further comprises determining a total number of bits for the first set of data, determining a Hamming weight for the first set of data, detecting that the semiconductor memory comprises a phase change memory, and generating a Hamming distance-based encoding for the first set of data in response to detecting that the first set of data is to be written to the phase change memory. The generating the Hamming distance-based encoding for the first set of data includes detecting that the binary number minus the total number of bits choose one is greater than or equal to zero and reducing the binary number by the total number of bits choose one in response to detecting that the binary number minus the total number of bits choose one is greater than or equal to zero. The generating the Hamming distance-based encoding for the first set of data includes detecting that the reduced binary number is greater than or equal to the total number of bits minus one choose the Hamming weight for the first set of data and setting a bit position within an output array to one in response to detecting that the reduced binary number is greater than or equal to the total number of bits minus one choose the Hamming weight for the first set of data. The generating the Hamming distance-based encoding for the first set of data includes outputting the output array as the Hamming distance-based encoding for the first set of data and writing the Hamming distance-based encoding for the first set of data to the phase change memory.

One embodiment of the disclosed technology includes a semiconductor memory and one or more control circuits. The one or more control circuits configured to acquire a first set of data associated with a binary number and detect that the semiconductor memory comprises a particular type of memory. The first set of data comprises a total number of bits. The one or more control circuits configured to generate a Hamming distance-based encoding for the first set of data in response to detection that the first set of data is to be stored using the particular type of memory. The one or more control circuits configured to determine a Hamming weight for the first set of data and one or more bit positions corresponding with non-zero values within the first set of data. The one or more control circuits configured to initialize a loop variable and an output variable and update the output variable while the loop variable is less than the Hamming weight for the first set of data such that the output variable is assigned the output variable plus the total number of bits for the first set of data choose the loop variable. The one or more control circuits configured to determine a first value equal to the total number of bits for the first set of data minus one minus a bit position of the one or more bit positions corresponding with the loop variable. The one or more control circuits configured to determine a second value equal to the Hamming weight for the first set of data minus the loop variable. The one or more control circuits configured to initialize the loop variable and update the output variable while the loop variable is less than the Hamming weight for the first set of data such that the output variable is assigned the output variable plus the first value choose the second value. The one or more control circuits configured to output the output variable as the Hamming distance-based encoding for the first set of data and write the Hamming distance-based encoding for the first set of data to the semiconductor memory.

One embodiment of the disclosed technology includes acquiring a first set of data to be written to a semiconductor memory. The first set of data is associated with a binary number. The method further comprises determining a total number of bits for the first set of data, detecting that the semiconductor memory comprises a phase change memory, and generating a Hamming distance-based encoding for the first set of data in response to detecting that the first set of data is to be written to the phase change memory. The generating the Hamming distance-based encoding for the first set of data includes determining a Hamming weight for the first set of data and one or more bit positions corresponding with non-zero values within the first set of data. The generating the Hamming distance-based encoding for the first set of data includes initializing a loop variable and an output variable and updating the output variable while the loop variable is less than the Hamming weight for the first set of data such that the output variable is assigned the output variable plus the total number of bits for the first set of data choose the loop variable. The generating the Hamming distance-based encoding for the first set of data includes determining a first value equal to the total number of bits for the first set of data minus one minus a bit position of the one or more bit positions corresponding with the loop variable. The generating the Hamming distance-based encoding for the first set of data includes determining a second value equal to the Hamming weight for the first set of data minus the loop variable. The generating the Hamming distance-based encoding for the first set of data includes reinitializing the loop variable and updating the output variable while the loop variable is less than the Hamming weight for the first set of data such that the output variable is assigned the output variable plus the first value choose the second value. The method further comprises writing the Hamming distance-based encoding for the first set of data to the phase change memory.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
a semiconductor memory; and
one or more control circuits configured to acquire a first set of data associated with a binary number and detect that the semiconductor memory comprises a particular type of memory, the first set of data comprises a total number of bits, the one or more control circuits configured to store the first set of data associated with the binary number in a memory buffer and generate a Hamming distance-based encoding for the first set of data associated with the binary number in response to detection that the first set of data is to be stored using the particular type of memory, the one or more control circuits configured to encode the first set of data associated with the binary number using the Hamming distance-based encoding, the one or more control circuits configured to detect that the binary number minus the total number of bits choose one is greater than or equal to zero and reduce the binary number by the total number of bits choose one in response to detection that the binary number minus the total number of bits choose one is greater than or equal to zero, the one or more control circuits configured to initialize a loop variable and an output array, the one or more control circuits configured to determine a Hamming weight for the first set of data, the one or more control circuits configured to detect that the reduced binary number is greater than or equal to the total number of bits minus one choose the Hamming weight for the first set of data and set a bit position within the output array corresponding with the loop variable to one in response to detection that the reduced binary number is greater than or equal to the total number of bits minus one choose the Hamming weight for the first set of data, the one or more control circuits configured to output the output array as the Hamming distance-based encoding for the first set of data and write the Hamming distance-based encoding for the first set of data to the semiconductor memory.

2. The apparatus of claim 1, wherein:
the one or more control circuits configured to detect that the semiconductor memory comprises a phase change memory and generate the Hamming distance-based encoding for the first set of data in response to detection that the semiconductor memory comprises the phase change memory.

3. The apparatus of claim 1, wherein:
the one or more control circuits configured to detect that the particular type of memory has experienced more than a threshold number of bit errors and generate the Hamming distance-based encoding for the first set of data in response to detection that the particular type of memory has experienced more than the threshold number of bit errors.

4. The apparatus of claim 1, wherein:
the one or more control circuits configured to detect that the semiconductor memory has a threshold number of defects and generate the Hamming distance-based encoding for the first set of data in response to detection that the semiconductor memory has the threshold number of defects.

5. The apparatus of claim 1, wherein:
the one or more control circuits configured to detect that the semiconductor memory has at least a threshold number of word line defects and generate the Hamming distance-based encoding for the first set of data in response to detection that the semiconductor memory has at least the threshold number of word line defects.

6. The apparatus of claim 1, wherein:
the one or more control circuits configured to detect that data previously written to the semiconductor memory has experienced at least a threshold number of bit errors and generate the Hamming distance-based encoding for the first set of data in response to detection that the data previously written to the semiconductor memory has experienced at least the threshold number of bit errors.

7. The apparatus of claim 1, wherein:
the one or more control circuits configured to precompute all values of a choose b for a ranging from 1 to the total number of bits for the first set of data and b ranging from 0 to a and store the precomputed values using the semiconductor memory.

8. The apparatus of claim 1, wherein:
the total number of bits for the first set of data comprises 128 bits.

9. The apparatus of claim 1, wherein:
the semiconductor memory comprises a non-volatile memory that is monolithically formed in one or more physical levels of memory cells having active areas disposed above a silicon substrate.

10. An apparatus, comprising:
a phase change memory;
a memory buffer;
a control circuit configured to acquire a first set of data associated with a binary number and store the first set of data associated with the binary number using the memory buffer, the first set of data comprises a total number of bits; and
means for generating a Hamming distance-based encoding for the first set of data associated with the binary number, the means for generating the Hamming distance-based encoding encodes the first set of data associated with the binary number using the Hamming distance-based encoding, the means for generating the Hamming distance-based encoding determines a Hamming weight for the first set of data, detects that the binary number minus the total number of bits choose one is greater than or equal to zero, reduces the binary number by the total number of bits choose one in response to detection that the binary number minus the total number of bits choose one is greater than or equal to zero, initializes a loop variable and an output array, detects that the reduced binary number is greater than or equal to the total number of bits minus one choose the Hamming weight for the first set of data, and sets a bit position within the output array corresponding with the loop variable to one in response to detection that the reduced binary number is greater than or equal to the total number of bits minus one choose the Hamming weight for the first set of data, the control circuit configured to output the output array as the Hamming distance-based encoding for the first set of data and write the Hamming distance-based encoding for the first set of data to the phase change memory.

11. The apparatus of claim 10, wherein:
the control circuit configured to detect that the phase change memory has experienced more than a threshold number of bit errors and cause the Hamming distance-based encoding for the first set of data to be generated in response to detection that the phase change memory has experienced more than the threshold number of bit errors.

12. The apparatus of claim 10, wherein:
the control circuit configured to detect that the phase change memory has a threshold number of defects and cause the Hamming distance-based encoding for the first set of data to be generated in response to detection that the phase change memory has the threshold number of defects.

13. The apparatus of claim 10, wherein:
the control circuit configured to detect that the phase change memory has at least a threshold number of word line defects and cause the Hamming distance-based encoding for the first set of data to be generated in response to detection that the phase change memory has at least the threshold number of word line defects.

14. The apparatus of claim 10, wherein:
the control circuit configured to detect that data previously written to the phase change memory has experienced at least a threshold number of bit errors and cause the Hamming distance-based encoding for the first set of data to be generated in response to detection that the data previously written to the semiconductor memory has experienced at least the threshold number of bit errors.

15. The apparatus of claim 10, wherein:
the total number of bits for the first set of data comprises 256 bits.

16. The apparatus of claim 10, wherein:
the phase change memory comprises a non-volatile memory that is monolithically formed in one or more physical levels of memory cells having active areas disposed above a silicon substrate.

17. A method, comprising:
acquiring a first set of data to be written to a semiconductor memory, the first set of data is associated with a binary number;
storing the first set of data associated with the binary number in a memory buffer;
determining a total number of bits for the first set of data;
determining a Hamming weight for the first set of data;
detecting that the semiconductor memory comprises a phase change memory;
generating a Hamming distance-based encoding for the first set of data associated with the binary number in response to detecting that the first set of data is to be written to the phase change memory, the generating the Hamming distance-based encoding includes encoding the first set of data associated with the binary number using the Hamming distance-based encoding, the generating the Hamming distance-based encoding for the first set of data includes detecting that the binary number minus the total number of bits choose one is greater than or equal to zero and reducing the binary number by the total number of bits choose one in response to detecting that the binary number minus the total number of bits choose one is greater than or equal to zero, the generating the Hamming distance-based encoding for the first set of data includes detecting that the reduced binary number is greater than or equal to the total number of bits minus one choose the Hamming weight for the first set of data and setting a bit position within an output array to one in response to detecting that the reduced binary number is greater than or equal to the total number of bits minus one choose the Hamming weight for the first set of data, the generating the Hamming distance-based encoding for the first set of data includes outputting the output array as the Hamming distance-based encoding for the first set of data; and
writing the Hamming distance-based encoding for the first set of data to the phase change memory.

18. The method of claim 17, further comprising:
detecting that the phase change memory has experienced more than a threshold number of bit errors and generating the Hamming distance-based encoding for the first set of data in response to detecting that the phase change memory has experienced more than the threshold number of bit errors.

19. The method of claim 17, further comprising:
detecting that data previously written to the phase change memory has experienced at least a threshold number of bit errors and generating the Hamming distance-based encoding for the first set of data in response to detecting that the data previously written to the phase change memory has experienced at least the threshold number of bit errors.

20. The method of claim 17, further comprising:
acquiring a second set of data to be written to a second semiconductor memory, the second set of data is associated with a second binary number different from the binary number;
detecting that the second semiconductor memory has experienced less than a threshold number of bit errors; and
writing the second set of data to the second semiconductor memory in response to detecting that the second semiconductor memory has experienced less than the threshold number of bit errors.

* * * * *